United States Patent
Scott et al.

(10) Patent No.: US 6,410,413 B2
(45) Date of Patent: Jun. 25, 2002

(54) SEMICONDUCTOR DEVICE WITH TRANSPARENT LINK AREA FOR SILICIDE APPLICATIONS AND FABRICATION THEREOF

(75) Inventors: Gregory Stuart Scott, Santa Clara; Emmanuel de Muizon, Fremont; Martin Harold Manley, Saratoga, all of CA (US)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

(21) Appl. No.: 09/912,194

(22) Filed: Jul. 24, 2001

Related U.S. Application Data

(62) Division of application No. 09/271,737, filed on Mar. 18, 1999, now Pat. No. 6,326,675.

(51) Int. Cl.[7] ................................. H01L 21/44
(52) U.S. Cl. ................... 438/601; 438/511; 257/608
(58) Field of Search .................. 438/275, 643, 438/597–601, 510–511; 257/382–384, 607–611

(56) References Cited

U.S. PATENT DOCUMENTS 4,766,516 A * 8/1988 Ozdemir et al. ............ 361/380

* cited by examiner

Primary Examiner—Matthew Smith
Assistant Examiner—Calvin Lee

(57) ABSTRACT

Useful to inhibit reverse engineering, semiconductor devices and methods therefore include formation of two active regions over a substrate region in the semiconductor device. According to an example embodiment, a dopable link, or region, between two heavily doped regions can be doped to achieve a first polarity type, with the two heavily doped regions of the opposite polarity. If dictated by design requirements, the dopable region is adapted to conductively link the two heavily doped regions. A dielectric is formed over the dopable region and extends over a portion of each of the two heavily doped regions to inhibit silicide formation over edges of the dopable region. In connection with a salicide process, a silicide is then formed adjacent the dielectric and formed over another portion of the two heavily doped regions.

9 Claims, 2 Drawing Sheets

SEMICONDUCTOR DEVICE WITH TRANSPARENT LINK AREA FOR SILICIDE APPLICATIONS AND FABRICATION THEREOF

RELATED PATENT DOCUMENTS

This is a divisional of Ser. No. 09/271,737, filed on Mar. 18, 1999 (VLSI.232PA) and issued as U.S. Pat. No. 6,326,675, to which Applicant claims priority under 35 U.S.C.§120.

FIELD OF THE INVENTION

The present invention relates generally to semiconductor devices and semiconductor manufacturing and, more particularly, to semiconductor devices using silicide processes generally and in connection with efforts to inhibit reverse engineering.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, BiCMOS transistors, etc.

Each of these semiconductor devices generally includes a semiconductor substrate on which a number of active devices are formed. The particular structure of a given active device can vary between device types. While the particular structure of a given active device can vary between device types, a MOS-type transistor generally includes heavily doped diffusion regions, referred to as source and drain regions, and a gate electrode that modulates current flowing in a channel between the source and drain regions.

One important step in the manufacturing of such devices is the formation of isolation areas to electrically separate electrical devices or portions thereof that are closely integrated in the silicon wafer. Typically, current does not flow between active regions of adjacent MOS-type transistors. However, in certain circuit designs it is desirable to electrically link source/drain diffusions of adjacent MOS-type transistors. Such linking is useful in various circuit design applications including, for example, adjacent transistor circuits requiring resistive transistor intercoupling.

In circuit applications involving two diffusion regions of the same polarity type, such as two P+ doped adjacent regions in an N-well substrate area, the portion of the substrate area between the two adjacent regions can be used as an electrical insulator. More specifically, each heavily doped diffusion region and a portion of adjacent substrate act as a reverse-biased diode blocking the flow of electrons between the two diffusions. Conversely, the portion of the substrate area between the two adjacent regions can also be implemented to act as an electrical conductor. One way to implement such conduction is to effect the same polarity in the portion of the substrate area between the two adjacent regions as the polarity of the two adjacent regions. Accordingly, each adjacent heavily doped region can be doped simultaneously with the portion of the substrate area between the two adjacent regions to overcome the reverse-biased diode effect.

For many designers, linking two active regions of the same polarity type in this manner is desirable for preventing reverse engineering by competitors. Reverse engineering involves the use of analytical techniques, such as scanning-electron microscopy, to determine the design of an integrated circuit including identification of electrical connections between active regions. For many analytical techniques, including scanning-electron microscopy, linking and blocking connectivity between two active regions of the same polarity type, in the manner described above, appears identical and thereby undermines the typical reverse-engineering effort.

This approach is not readily achievable for all circuit architectures, particularly those involving salicide processes. Salicide processing refers to self-aligned silicide processing; in which metal is heat-reacted with silicon to form "silicide" over an active region to form contact regions over the silicide with minimal masking steps. In a salicide process, siliciding two heavily doped regions of the same polarity normally results in silicide forming over the portion of the substrate area between the two adjacent regions which, in turn, results in shorting the two heavily doped regions. Because the two adjacent regions are linked by the detectable silicide, typical reverse-engineering efforts can readily detect whether or not the adjacent heavily doped regions are electrically linked.

SUMMARY OF THE INVENTION

The present invention is exemplified in a number of implementations, some of which are summarized below. According to one embodiment, a method of fabricating a semiconductor device, includes first forming a dopable region between two heavily doped regions over a substrate region in the semiconductor device, with the substrate region doped to achieve a first polarity type, and with the two heavily doped regions doped to achieve a second polarity type that is opposite the first polarity type. The dopable region is adapted to selectively link the two active regions when doped to achieve the second polarity type. Further, over the dopable region and extending over a portion of each of the two heavily doped regions, a dielectric is formed that is adapted to inhibit silicide formation over edges of the dopable region and the structure is silicided adjacent the dielectric over another portion of at least one of the two heavily doped regions.

In another embodiment of the present invention, a semiconductor device, comprises: two heavily doped regions over a substrate region in the semiconductor device; a dopable region between the two heavily doped regions, the substrate region doped to achieve a first polarity type, wherein the two active regions are doped to achieve a second polarity type that is opposite the first polarity type, and wherein the dopable region is adapted to selectively link the two heavily doped regions when doped to achieve the second polarity type; a dielectric formed over the dopable region and extending over a portion of each of the two active regions, the dielectric adapted to inhibit silicide formation over edges of the dopable region; and a silicide formation adjacent the dielectric over another portion of at least one of the two heavily doped regions.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
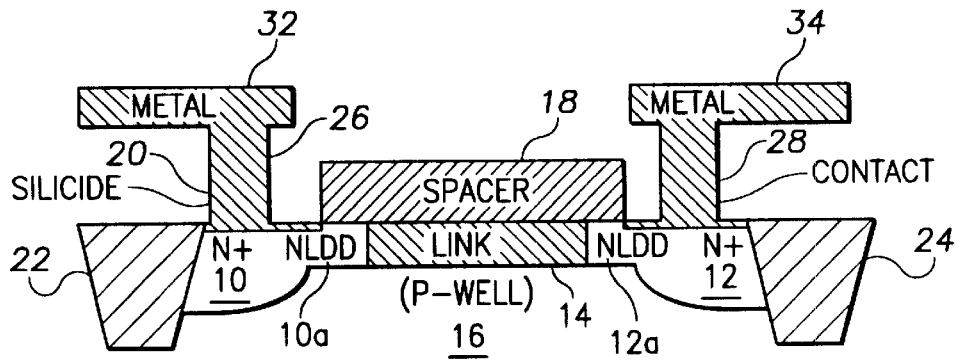
FIG. 1 illustrates a cross-sectional view of a semiconductor structure including two adjacent heavily doped regions of the same polarity type, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention has been found to be particularly advantageous in applications where it is desirable to inhibit or prevent reverse-engineering efforts. While the present invention is not necessarily limited to this environment, an appreciation of various aspects of the invention is best gained through a discussion of example of such applications.

One particular example implementation of the present invention is directed to a semiconductor device and its fabrication. The semiconductor device is manufactured to include a diffusion region separating two active regions over a substrate region in the semiconductor device. The substrate region is of one polarity type, N-type or P-type, and each of the two heavily doped regions is the same opposite polarity type, P+ or N+, respectively, with a portion of the heavily doped region extending into the substrate. Over the diffusion region and a portion of each of the two active regions, a dielectric (such as a spacer oxide or other insulative material) is formed to inhibit silicide formation over edges of the dopable region. Metal is applied and a silicide is formed adjacent the dielectric over another portion of one or both active regions.

Depending on the design requirements, the active regions can relate to one another electrically as: inter-linked, for example, by doping the diffusion region to achieve the same polarity type as the active regions; isolated from one another by blocking this diffusion region, for example, by appropriately masking to block the doping/implanting step; or resistively-linked, for example, by doping the diffusion area selectively (e.g., lightly relative to the doping concentration of the respective active areas on either side of the diffusion area). In each instance, the structure will appear identical under a microscope.

Turning now to the drawings, FIG. 1 depicts a cross-sectional view of another example embodiment of a semiconductor structure, also according to the present invention. The semiconductor structure of FIG. 1 includes two adjacent active regions 10 and 12 doped N+, with a diffusion area 14 between, a P+ well 16 underneath, and an oxide spacer 18 atop. Field oxide regions 22 and 24 are depicted on either side of the active regions 10 and 12 in this example structure.

Nearest the diffusion area 14, portions of each of two adjacent active regions 10 and 12 include lightly doped (e.g., NLDD) areas 10a and 12a, respectively. The NLDD areas 10a and 12a extend beneath the oxide spacer 18 to prevent shorting of the adjacent N+ region 10 or 12 to the P well 16, and with sufficient overlap between the oxide spacer 18 and the NLDD areas 10a and 12a to allow for mask alignment tolerances and loss of spacer during subsequent processing. According to one application/circuit-design, the diffusion area 14 acts as an insulator in a manner similar to two reverse-biased diodes. Alternatively, a link is formed between the two NLDD areas 10a and 12a by implanting NLDD under the entire spacer. As a further alternative, a resistive link between the two NLDD areas 10a and 12a can be achieved by implanting NLDD in a selective manner to define the desired resistive characteristics in the link area. For example, the implant can be implemented selectively to achieve a complete link by evenly doping under the entire spacer, or selectively to achieve a resistive link by doping with selective concentrations and/or areas under the spacer. With the dopant concentration, or lack thereof, undetectable by microscopy, the structure serves to frustrate conventional reverse-engineering efforts.

Metal is applied and a silicide 20 is formed adjacent the oxide spacer 18 over both active regions 10 and 12. Contacts 26 and 28 are then formed after formation of the silicide, and connections 32 and 34 are then made to the contacts 26 and 28 via metal lines.

Figure 2:
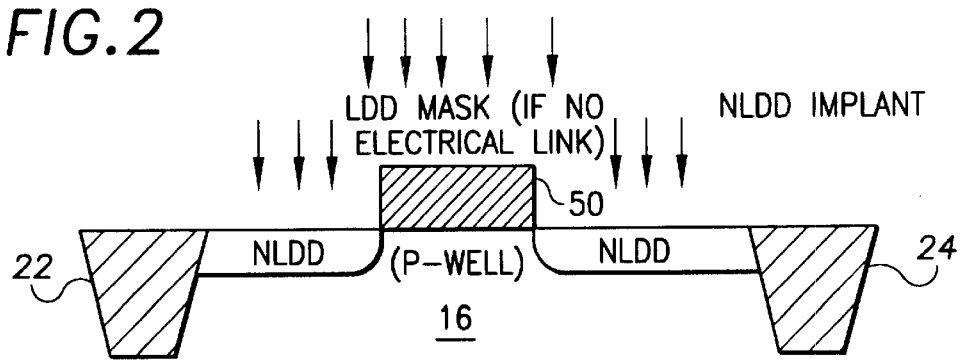
FIGS. 2 through 6 are cross-sectional views illustrating process steps useful in forming the semiconductor structure of FIG. 1, in accordance with the present invention.
Figure 3:
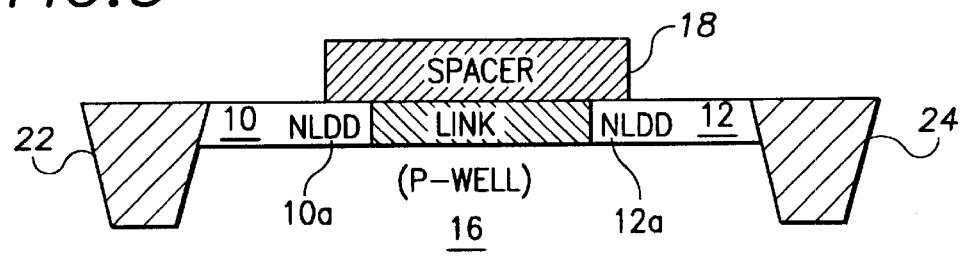
Figure 4:
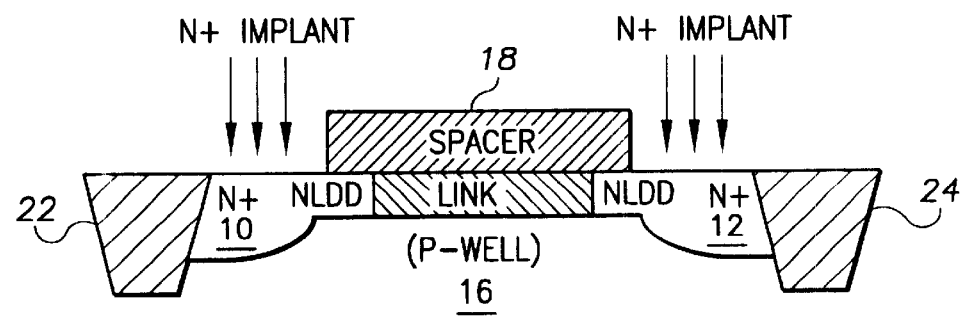
Figure 5:
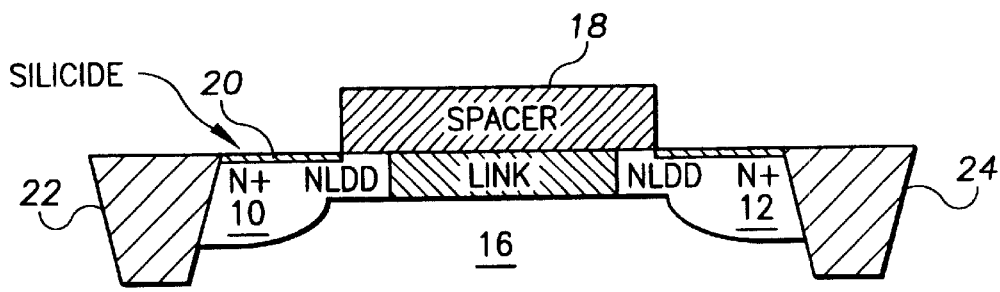
Figure 6:
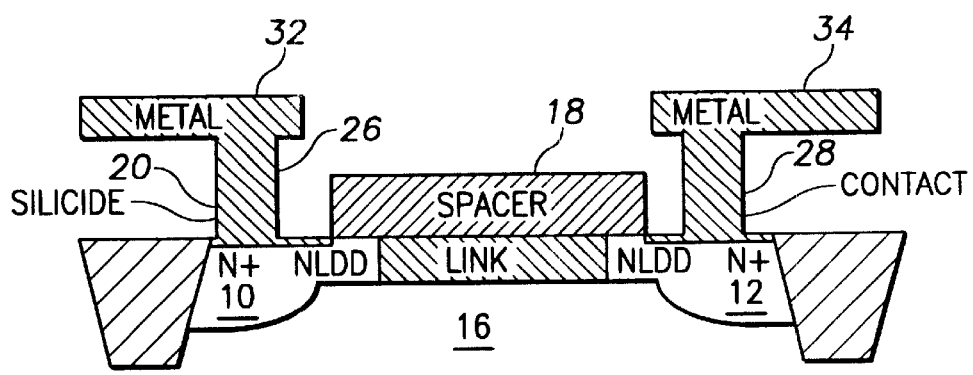

FIGS. 2 through 6 illustrate an example set of process steps useful in forming the semiconductor structure of FIG. 1, also in accordance with the present invention. In one example implementation, these process steps are used in connection with a standard 0.25 micron process flow. FIG. 2 depicts the formation of the LDD mask 50 in the form of a line of resist, in the situation where the diffusion area is not doped to link the active areas 10a and 12a of FIG. 1. The diffusion area may also be doped to link the active areas 10a and 12a, for example, by eliminating this step depicted in FIG. 2. In FIG. 3, after removing the resist, a spacer mask and an etch step are used to define an oxide region, or oxide spacer 18, with sufficient overlap to isolate the diffusion area to allow for mask alignment and spacer loss in the areas 10a and 12a (for the case of isolated nodes or active-regions). Next, an N+ implant is used to define the heavier-doped N+ regions 10 and 12 as shown in FIG. 4. As depicted in FIG. 5, a salicide processing step leaves a layer of silicide 20 on the active regions 10 and 12, with the oxide spacer 18 used to block silicide formation that would otherwise short the N+ regions together across the top of the diffusion area. As show in FIG. 6, the contacts and metal connections are formed to complete this stage of processing, and the device is connected to the appropriate nodes as defined by the circuit specifications.

Figure 7:
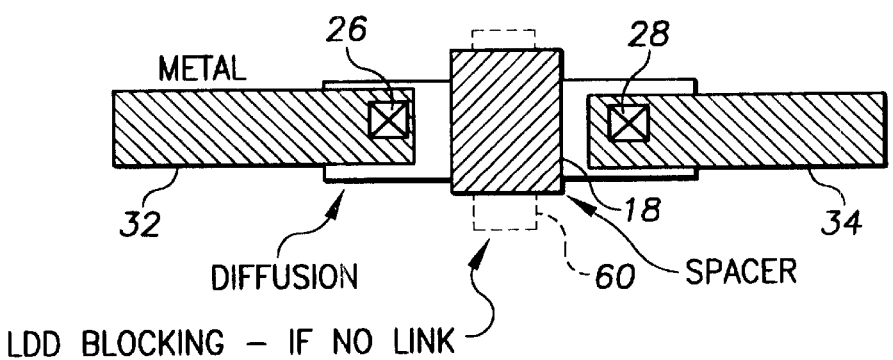
FIG. 7 is a top-down view showing the architecture of the semiconductor structure of FIG. 1, in accordance with another example embodiment of the present invention.

FIG. 7 is a top-down view showing the architecture of the semiconductor structure of FIG. 1, in accordance with another example embodiment of the present invention. The dotted-line region, depicted as 60, shows the area where the LDD implant was blocked, in the instance where no link was formed between the two active regions.

In one example application involving a standard 0.25 micron process flow, a minimum link size includes one square of non-silicided LDD diffusion, providing a resistance of about 1000 Ohms. Greater or lesser resistances can of course be realized, for example, by changing the width of the link.

In another example process, also consistent with the present invention, a salicide-exclusion process involves depositing a dieletric film and then etching the film immediately prior to silicide formation. In this instance, the dielectric layer is designed to overlap the heavily doped regions, thereby eliminating any need for a lightly doped implant when a link between the active regions is unnecessary.

Accordingly, the present invention has a number of advantageous aspects. For instance, the implemented function of the link area in each of the above-discussed embodiments is undetectable using conventional microscopy. Another significant advantage is that the link area can be implemented as a conductive link or resistive link without adding steps to a conventional manufacturing process. For example, the conductive/resistive link can be implemented during the implant step(s) for the active region. Implant steps for building active regions is conventional and therefore adds no further significant cost or delay.

While the present invention has been described with reference to several particular example embodiments, those skilled in the art will recognize that many changes may be made thereto. Another variation, for example, involves use of only one side of the spacer to block silicide-related shorting. These changes and other departures from the above discussion of example embodiments are within the spirit and scope of the present invention, as set forth in the following claims.

What is claimed is:

1. A method of fabricating a semiconductor device, comprising:

forming a dopable region between two regions over a substrate region in the semiconductor device, the substrate region doped to achieve a first polarity type, wherein the two regions are doped to achieve a second polarity type that is opposite the first polarity type, and wherein the dopable region is adapted to selectively link the two regions when doped to achieve the second polarity type;

over the dopable region and extending over a portion of each of the two regions, forming a dielectric that is adapted to inhibit silicide formation over edges of the dopable region; and siliciding adjacent the dielectric over another portion of at least one of the two regions.

2. A method of fabricating a semiconductor device, according to claim 1, further including doping the dopable region to conductively link the two regions.

3. A method of fabricating a semiconductor device, according to claim 1, wherein siliciding adjacent the dielectric includes forming self-aligned silicide contacts over the other portion of at least one of the two regions.

4. A method of fabricating a semiconductor device, according to claim 1, further including doping each of the two regions to include a relatively heavy doped area and a relatively lightly doped area, the dielectric extending over at least a portion of each relatively lightly doped area.

5. A method of fabricating a semiconductor device, according to claim 1, further including doping each of the two regions to include a relatively heavy doped area and a relatively lightly doped area, the dielectric extending over at least a portion of each relatively lightly doped area, and wherein siliciding adjacent the dielectric includes forming self-aligned silicide contacts over the relatively heavy doped area of at least one of the two regions.

6. A method of fabricating a semiconductor device, according to claim 5, wherein doping each of the two regions to include a relatively heavy doped area and a relatively lightly doped area further includes doping the dopable region to conductively link the two regions.

7. A method of fabricating a semiconductor device, according to claim 5, wherein doping each of the two regions to include a relatively heavy doped area and a relatively lightly doped area further includes selectively forming at least a portion of the dopable region as resistive between the two regions.

8. A method of fabricating a semiconductor device, according to claim 1, further including selectively forming at least a portion of the dopable region as resistive between the two regions.

9. A method of fabricating a semiconductor device, according to claim 1, wherein each of the two regions does not include a relatively lightly doped area.

* * * * *